(12) United States Patent
Leuthold

(10) Patent No.: US 6,778,025 B1
(45) Date of Patent: Aug. 17, 2004

(54) SYSTEM AND METHOD FOR SIMULATING THE NOISE CHARACTERISTICS OF PHASE LOCKED LOOPS IN TRANSIENT ANALYSIS

(75) Inventor: Oskar Leuthold, Santa Cruz, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 10/395,768

(22) Filed: Mar. 24, 2003

(51) Int. Cl.[7] .................................................. H03B 3/10
(52) U.S. Cl. ............................................. 331/16; 716/6
(58) Field of Search ........................... 331/16, 14, 1 A; 327/156; 716/6, 1; 375/226

(56) References Cited

U.S. PATENT DOCUMENTS 5,987,238 A * 11/1999 Chen .............................. 716/1
6,671,863 B2 * 12/2003 Gauthier et al. ............... 716/6

OTHER PUBLICATIONS

White Paper entitled "Advanced Techniques for the Simulation of Mixed–Signal Integrated Circuits" by Antrim Design Systems, Inc.

White Paper entitled "The Characterization and Behavioral Model Generation of Analog Intellectual Property" by Antrim Design Systems, Inc.

\* cited by examiner

*Primary Examiner*—Robert Pascal
*Assistant Examiner*—Joseph Chang
(74) *Attorney, Agent, or Firm*—Fliesler Meyer LLP

(57) ABSTRACT

A system and method for simulating the noise characteristics of phase locked loops (PLL's) and other devices. Voltage Controlled Oscillator (VCO) transfer function and phase noise data is first imported for a particular circuit from a Radio Frequency (RF) simulator. The phase locked loop blocks in the circuit are converted to calibrated behavioral-level models. A combined analog/digital model is used to model the VCO, which in turn uses a pseudorandom signal generator for simulating VCO noise. Information about VCO periods is then written to a file or memory for post-processing, such as creating noise spectrum data and noise spectrum plots.

22 Claims, 8 Drawing Sheets

SYSTEM AND METHOD FOR SIMULATING THE NOISE CHARACTERISTICS OF PHASE LOCKED LOOPS IN TRANSIENT ANALYSIS

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The invention relates generally to electronic circuit design and simulation and particularly to a system and method for simulating the noise characteristics of phase locked loops and other devices in transient analysis.

BACKGROUND

Designers of electronic circuits use a variety of simulation tools to simulate potential new circuit designs. Examples of such circuit design tools include those developed by Antrim Design Systems, Inc., and Cadence Design Systems, Inc. These circuit design tools are particularly important in the area of telecommunication circuit design, and in particular the design of wireless transmitters, since the transmitters must meet stringent requirements for the spectrum of the signal they send out or transmit.

Common electronic devices found in telecommunication circuits include oscillators and phase-locked loops. Generally described, an oscillator is an electronic device that can be used to generate a signal. Oscillators are found in a wide variety of devices and appliances, including computers and cellular telephones. Most oscillators operate by employing a sensitive amplifier, the output of which is fed back to the input. In this way the signal uses positive feedback to sustain itself. The frequency at which an oscillator operates can be determined by a quartz crystal, although a combination of inductors, resistors, and capacitors can also be used to determine the frequency.

A phase-locked loop (often referred to as a PLL) is an electronic circuit with a voltage-driven or current-driven oscillator that is constantly adjusted to track the frequency of an input signal. In the telecommunications field, PLL's are often used to stabilize or lock onto a particular communications channel. PLL's are also frequently used in wireless communication systems. A typical PLL comprises a voltage-controlled oscillator (VCO), which is tuned to a frequency close to the desired receiving or transmitting frequency of the PLL. The VCO output signal is typically divided in a frequency divider. A phase comparator allows the output of the divider to match the output of a reference oscillator. If the VCO frequency departs from the desired frequency, the output of the divider will correspondingly depart from the reference frequency, and the phase comparator applies a voltage to bring the VCO back to that desired frequency. The reference oscillator and the PLL, with the VCO, the divider and the comparator may together be considered a frequency synthesizer.

Both oscillators and phase-locked loop devices are nowadays commonly manufactured as integrated circuits instead of as discrete circuits that use discrete inductors, comparators, etc. Because phase noise is very important in a telecommunication circuit, when designing these integrated circuits, designers need tools to predict the circuit's noise characteristics. Currently, tools do exist for predicting the noise characteristics of a VCO. These include RF simulators such as SpectreRF from Cadence Design Systems. However, these tools can not run a large signal transient analysis on the whole PLL.

SUMMARY

With the introduction of mixed mode simulators, which can handle both analog behavioral and digital, the simulation runtimes become reasonable for a transient analysis of a Phase Locked Loop (PLL) in the millisecond range. An embodiment of the present invention allows for Voltage Controlled Oscillator (VCO) noise, and any noise generated in the digital circuitry (by fractional dividers for example), to be included in the transient analysis. Other relevant noise sources may also be included. The phase noise characteristics of the VCO are first determined by a Radio Frequency (RF) simulator. A transient noise analysis is then performed using this data, thus including the VCO phase noise and the noise produced in the digital feedback part of the PLL. The system can also be used with other mixed mode simulators, and even system level simulators such as the Signal Processing Worksystem (SPW).

As described herein, an embodiment of the invention provides a system and method that utilizes behavioral models in simulating the noise characteristics of circuits and devices such as phase locked loops. In accordance with one embodiment, an initial step is to retrieve, or to generate VCO phase noise data for a given circuit. In practice, this VCO phase noise data may be generated by or received from an RF simulator. The phase locked loop (PLL) blocks are converted to calibrated behavioral-level models. This step enables the system to be represented as behavioral-level models instead of as discrete components, and allows the circuit to be simulated at a higher level of abstraction. The PLL simulation is verified using these models, without the noise generator being turned on or implemented, so that the noise floor of the mixed signal simulator can be determined. The transient analysis is then run with the noise generators turned on, and the results of the transient noise analysis post-processed to create noise spectrum data, which is then used to create noise spectrum plots. The noise spectrum data and/or plots may also be used in other ways, such as with other applications or with other analysis software.

DETAILED DESCRIPTION

Figure 1:
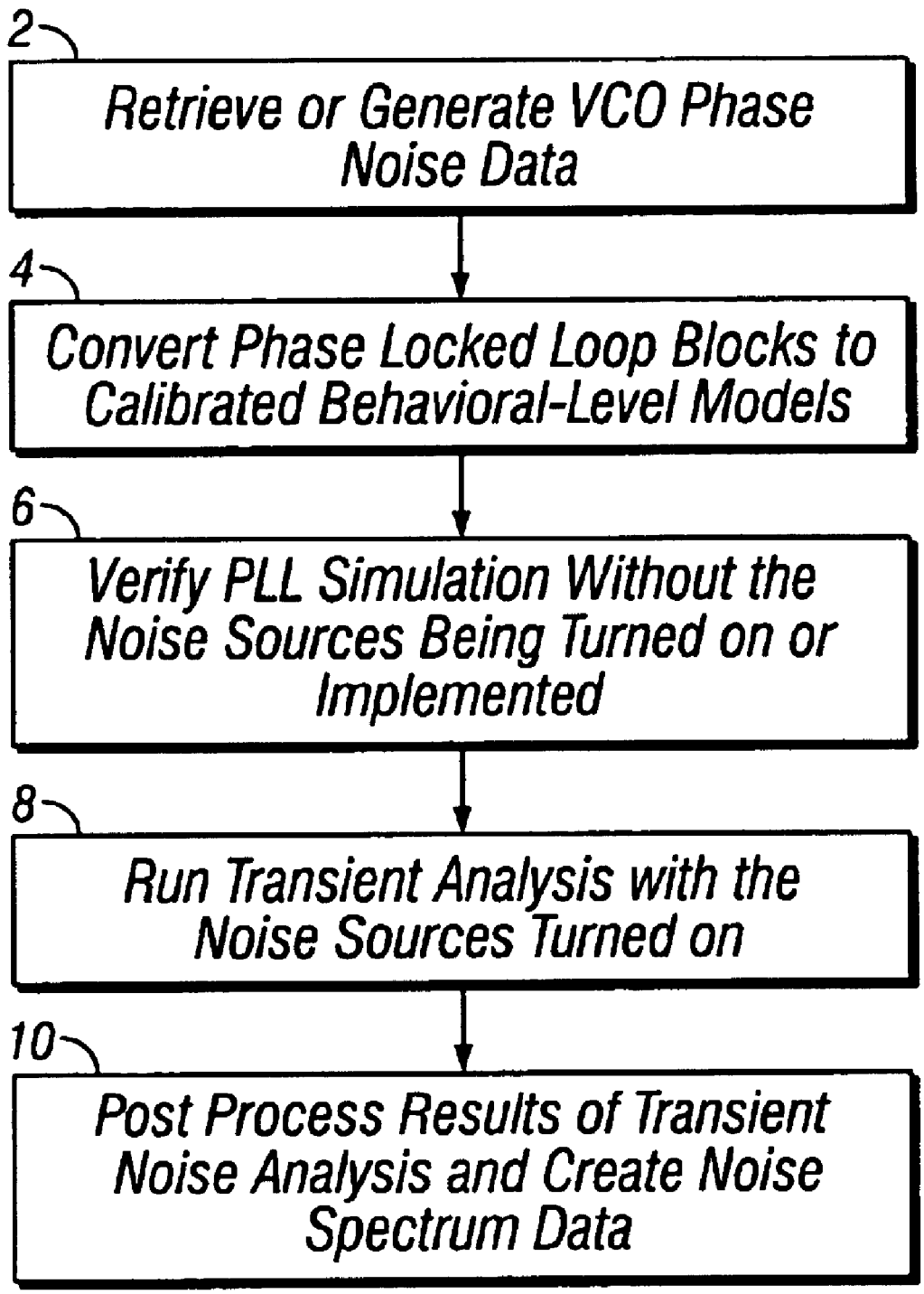
FIG. 1 illustrates an overview of the operation of a system or method in accordance with an embodiment of the invention.

Electronic circuit designers typically need to verify by simulation the characteristics of their proposed circuit before committing the design to silicon, i.e., before a mask set is generated and a prototype lot is run through a wafer fab. This is a particularly important issue in the area of radio frequency (RF) design, wherein the circuits often include many hundreds or thousands of transistors within the design. In addition, the transmitters that are used in RF circuits must meet stringent requirements for the spectrum of the signals they transmit. As such, the importance of being able to calculate noise within such a circuit or transmitter is particularly important to the designer. Currently, a circuit designer may have the tools necessary to predict the noise characteristics of a single voltage controlled oscillator (VCO), but there is no practical way to simulate the entire phase locked loop on the component level with the accuracy required for running a noise analysis. So, while a small signal-based noise analysis of a VCO may be considered a standard procedure, no current method exists for performing a transient noise analysis of the entire Phase Locked Loop (PLL). The transient noise analysis is required in order to include noise contribution from blocks other than the VCO.

However, with the introduction of mixed-mode simulators, which are designed to handle both analog behavioral and digital models, the runtime for simulating a whole PLL becomes reasonable for a transient analysis to be performed of the PLL over a millisecond range. With the reduction in simulation time, VCO noise and noise generated within the digital circuitry by, for example, fractional dividers or other blocks, can be included in the transient analysis.

Uses of Behavioral Models in Design

Behavioral models have many uses in circuit design, including the ability to rapidly explore new design architectures without having to actually build the design at low level. In behavioral models, the design is modeled according to its behavior at a higher level of abstraction. Instead of relying on references as to how the design is implemented, a behavioral model describes only how the design behaves. Behavioral models execute much faster than lower level transistor or device level models, primarily because a behavioral model uses a mathematical model of the circuit behavior instead of a model of the physical circuit effects. For example, a basic operational amplifier (opamp) can be modeled with the equation:

$$V_0(t) = \beta V_1(t+h)$$

Where the output voltage $V_0(t)$ is related to the input voltage $V_1(t+h)$ multiplied by the gain $\beta$. In the above equation, the variable h is related to the phase shift (delay) through the amplifier. The equation shown above represents a behavioral model which can be simulated many times faster than traditional compact device based models.

A useful application of behavioral models is that they can be generated and used in simulation without performing the full design. The process of "characterization" can be thought of as the removal of implementation-dependent information from a circuit component or cell. The circuit designer can then work with the cell in terms of what it does, instead of how it works. At tis highest level, the combination of characterization and behavioral model generation allow the creation of Silicon Calibrated Behavioral Models such as are used in the Antrim Aptivia system, and which can be substituted for actual cells or blocks during circuit simulation, design, and synthesis.

Since behavioral models simulate many times faster than traditional transistor level models, behavioral models that are silicon calibrated can provide accuracy approaching classic SPICE simulations, but at digital simulator speeds.

Additional information about circuit simulation, and about behavioral models can be found in the "Advanced Techniques for the Simulation of Mixed-Signal Integrated Circuits" and "The Characterization and Behavioral Model Generation of Analog Intellectual Property" white papers from Antrim Systems, Inc., incorporated herein by reference.

PLL Analysis

When applied to the problem of PLL analysis, from a practical point of view, the noise analysis of a PLL with 1 kHz noise frequency resolution requires approximately two milliseconds of simulation time. In a typical working environment employing current computer technology a simulation on the component level would typically take about two thousand hours to complete. Besides taking an inordinate amount of time to generate the simulation results, an added problem is that during the course of this two thousand hours, the amount of data that would be generated is typically larger than the system can handle. In addition, post-processing the data takes another inordinate amount of time. In effect, simulating the circuit on a component level is too time-consuming, and may not be suitable in order to get the actual product to market quickly.

However, using the systems and corresponding methods described in detail herein, the overall simulation time for an equivalent circuit can be cut to approximately one hour or less, which increases efficiency and greatly enhances the options available to the system designer, such as evaluating multiple design options, or simulating characterizations over process corners. A savings in simulation time of approximately one thousandfold is made possible by using behavioral models within the simulation framework. In accordance with one embodiment of the invention this is achieved by the use of an innovative VCO model.

An embodiment of the invention allows for VCO noise, and any noise generated in the digital circuitry (by fractional dividers for example), to be included in the transient analysis. Other relevant noise sources may also be included. The phase noise characteristics of the VCO are first calculated or derived from an RF simulator. A transient noise analysis is then performed using this data, which includes the VCO phase noise and the noise produced in all other parts of the PLL. The results of the transient noise analysis are post-processed to create noise spectrum data and noise spectrum plots. The system can also be used with other mixed mode simulators, and even system level simulators such as the Signal Processing Worksystem (SPW). Other features and benefits of the present invention are described in further detail below.

FIG. 1 illustrates a flowchart overview of the operation of a system or method in accordance with an embodiment of the invention. As shown in FIG. 1, an initial step 2 is to retrieve, or to generate VCO phase noise data for a given circuit, which will be used later to produce a noise floor. In practice, this VCO phase noise data may be imported from an RF simulator such as SpectreRF from Cadence Design Systems. In step 4, the phase locked loop (PLL) blocks are converted to calibrated behavioral-level models, using a system or application such as Aptivia. This step enables the system to be represented as behavioral-level models instead of as discrete components. As described above, the use of behavioral models allows the circuit to be simulated at a higher level of abstraction, and with greater efficiency and much shorter runtimes. In step 6, the PLL simulation is verified using these models, without the noise generator being turned on or implemented. This allows for calculating the noise floor for the circuit. In step 8, the transient analysis is then run with the noise generators turned on. In step 10, the results of the transient noise analysis are post-processed to create noise spectrum data, which can then be used to create noise spectrum plots by which designers can visually examine the noise characteristics of their PLL. The noise spectrum data may also be used in other ways, such as with other applications or other analysis software.

Figure 2:
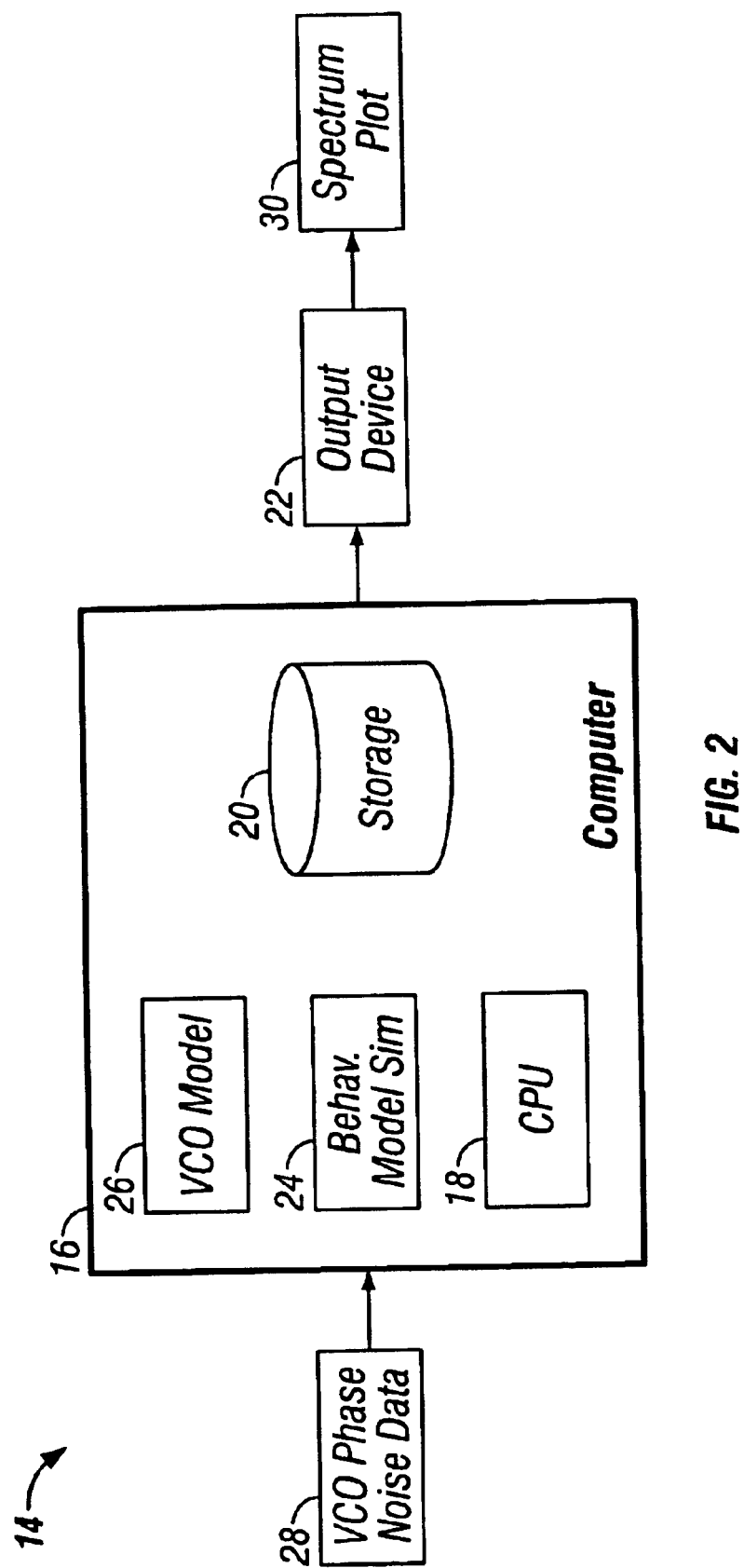
FIG. 2 illustrates a system in accordance with an embodiment of the invention that can be used to run a Phase Locked Loop (PLL) noise simulation, and produce a PLL noise spectrum plot.

FIG. 2 illustrates a system in accordance with an embodiment of the invention that can be used to run a PLL noise simulation, and produce a PLL noise spectrum plot. As shown in FIG. 2, the system 14 is designed to run on a computer or a similar machine that includes a processor 18 which performs a method shown in FIG. 1, although in other embodiments additional steps may be included. Typically, the system includes a storage 20 and an output device or alternate means for output 22, such as may be used for example to display or print the resultant spectrum plot. In accordance with one embodiment of the invention, the system includes a behavioral model simulator 24 for representing a circuit cell by a behavioral model. A VCO model 26 is then used to represent the VCO cell. The system either includes, or receives from an external source, the VCO phase noise data 28 describing the phase noise of the VCO currently being examined. The result of the simulation phase noise analysis is then output to the output device 22 as a spectrum plot 30, or as some other form of data output. It will be evident to those skilled in the art that other types of system besides that shown in FIG. 2 can be used within the spirit and scope of the invention to provide a PLL noise analysis.

Simulation Flow

Figure 3:
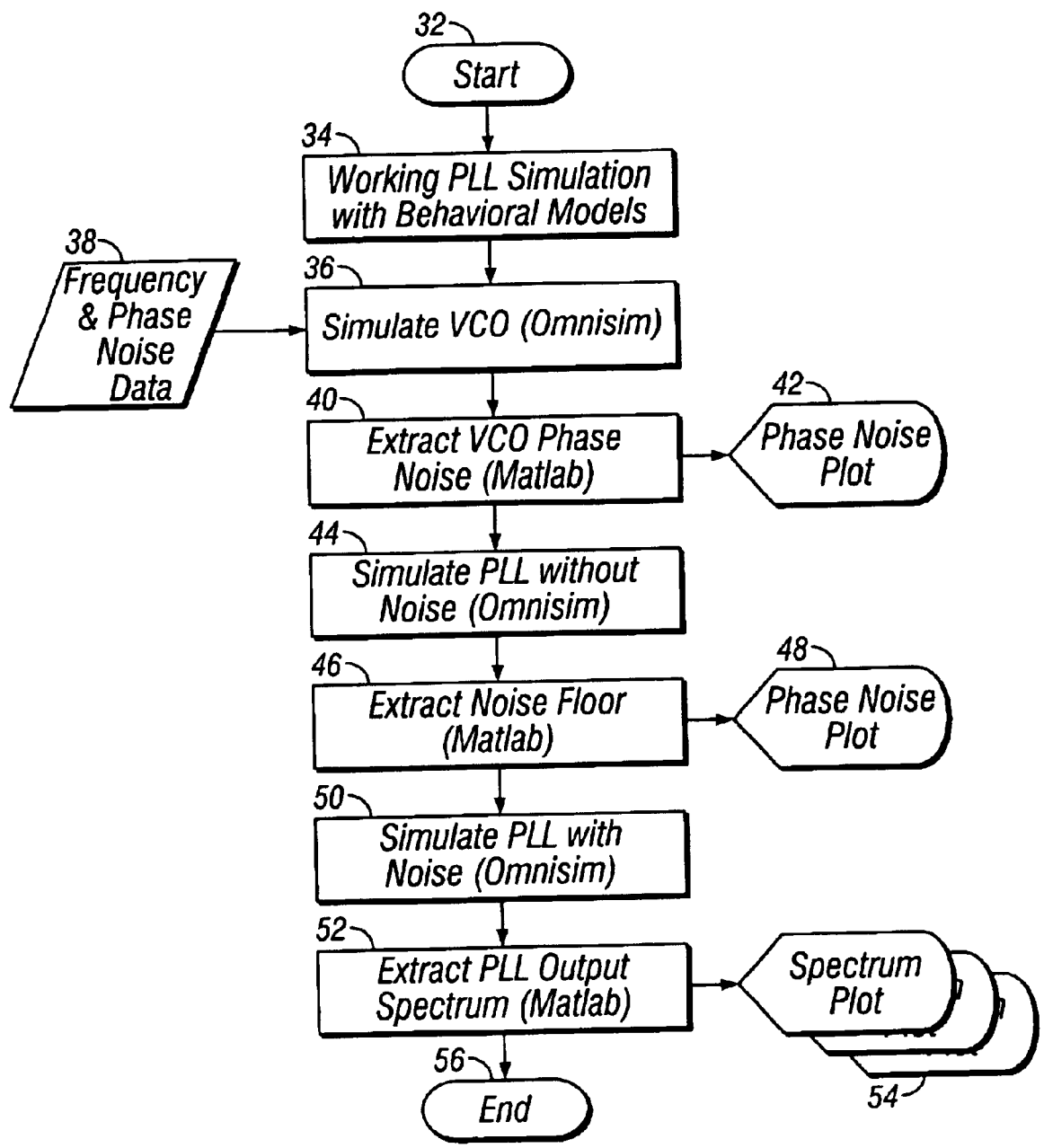
FIG. 3 illustrates a method in accordance with an embodiment of the invention that can be performed by a system such as shown in FIG. 2, to generate a PLL output spectrum.

FIG. 3 illustrates a method in accordance with an embodiment of the invention that can be performed by a system such as that shown in FIG. 2, to generate a PLL output spectrum, or output data, which can be then used by a circuit designer to examine the noise characteristics of their PLL design. As shown in FIG. 3, the process starts in step 32, and then proceeds to represent the working PLL simulation with behavioral models, in step 34. The behavioral model can either be simulated in a behavioral model simulator such as Omnisim from Antrim Design Systems, Inc., or with other behavioral model simulators. The next step 36 includes simulating the voltage-controlled oscillator VCO. This includes using frequency and phase noise data, in step 38, which can be entered into the system using a manual process, or which can be automatically supplied by another application or third-party application. In step 40, the phase noise for the VCO is extracted to produce, in step 42, a phase-noise plot. In step 44, the PLL is then simulated without noise, for example using Omnisim again. The frequency divider in the PLL is forced to divide by an integer, to prevent spurious signals from being injected into the loop. In step 46, the noise floor is extracted and the phase-noise plot updated in step 48. In step 50, the PLL is then simulated with noise, and the frequency divider ratio allowed to vary if required by the application. The resulting data is extracted in step 52 to represent the transient noise behavior of the PLL design. Instep 54, the PLL output spectrum data can be used to create, for example, a spectrum plot, which gives the circuit designer a visual representation of the frequency noise characteristics of their design. In step 56, the process ends.

The flowchart of FIG. 3 as described above illustrates the steps which are required for verifying intermediate results. The phase noise data of step 38 can be generated outside of this flow using a dedicated tool for this purpose, such as SpectreRF from Cadence Design Systems, Inc. A prerequisite to the process is a working PLL simulation, for example, in Omnisim, which uses behavioral models where applicable. The VCO model must also contain the various features described in further detail below. The loop filter voltage must be stable to microvolt levels after a certain settling time, at which point the noise analysis can start.

VCO Model

The key to the efficiency of the simulation is in the particular structure of the VCO model. In accordance with one embodiment of the invention, the VCO model comprises four blocks:

A frequency calculation block, which models the voltage-to-frequency characteristic of the VCO, i.e. generates a signal proportional to the VCO frequency.

An update control block, which precalculates the pseudorandom sequence of the phase noise.

A transient noise generator block, which uses information from the update control block to produce a pseudorandom transient signal.

A digital VCO block, which generates the digital output of the VCO and the result file.

These four blocks are described in further detail below. In one embodiment the voltage-to-frequency characteristic of the VCO is contained in a Frequency Data file, and the noise characteristics is contained in a Phase Noise Data file. Since in certain embodiments these files can be read directly into the system by VerilogA, they should adhere to the format requirements specified thereby.

Figure 4:
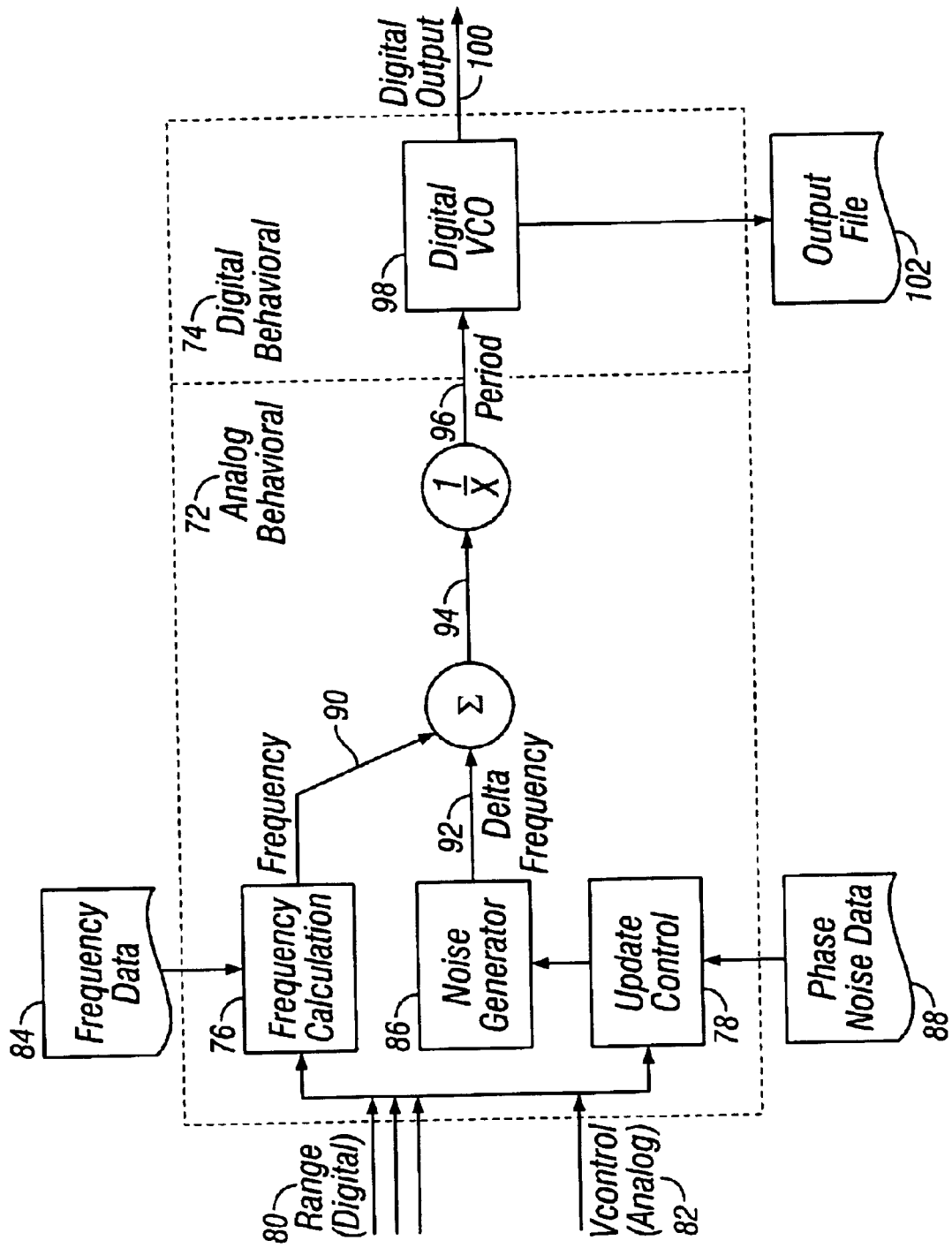
FIG. 4 illustrates a Voltage Controlled Oscillator (VCO) model in accordance with one embodiment of the invention.

FIG. 4 illustrates a VCO model in accordance with one embodiment of the invention. It will be evident that similar VCO designs may be used, including some additional embodiments that are described in further detail below. As shown in FIG. 4, the VCO model includes aspects both of the analog behavioral 72 and digital behavioral 74 qualities of the VCO design. The frequency calculator 76 (frequency calculation block) is used to model the voltage-to-frequency characteristic of the PLL. In particular, the frequency calculator generates a signal which is proportional to the VCO frequency, based on both the input voltage 82 and the gain settings. Frequency data 84 is provided to describe the relationship between frequency or period and input voltage for all valid combinations of the digital range 80 setting. The frequency data 84 may be supplied by an external frequency data file, as described above. An update control (update control block) 78 is used to update the pseudorandom sequence of the phase noise during the course of the simulation. The update cycle can be scheduled at an appropriate time so that it is only performed when necessary. The update control block uses the previously recorded phase noise data 88. A noise generator (transient noise generator block) 86 uses the sequence calculated by the update control block to generate a pseudorandom transient noise signal 92, which is proportional to VCO frequency, and which is typically much smaller than the signal 90 from the frequency calculator.

The analog behavioral portion 72 of the VCO sums the frequency-to-voltage signal 90 with the noise signal 92 to create a combined frequency-noise signal 94 (in one embodiment a voltage-to-frequency signal), which is proportional to the VCO frequency. This voltage-to-frequency signal can then be inverted to create a signal 96 which is proportional to the VCO period.

The digital behavioral component 74 of the VCO includes a digital VCO 98 (digital VCO block) to create both a digital VCO output 100 and an output file 102. The output file 102 contains the transient noise data that is eventually used to generate spectrum plots for the PLL.

The important components of the VCO model are described in further detail below, with respect to a particular implementation and embodiment. It will be evident that variations on this design may be made within the spirit and scope of the invention.

Frequency Calculation Block 76

The frequency calculation block 76 generates a signal which is proportional to the VCO frequency, from both the input voltage (generally the loop filter voltage) and the gain settings. In one embodiment a data table can be used to describe the relationship between period and input voltage for all valid combinations of the digital range setting code. This table can be generated by an RF simulator such as SpectreRF from Cadence Design Systems, Inc. The frequency calculation block 76 may also contain a means for generating the appropriate VCO control information in a calibration mode, as a function of a separate digital control word.

Update Control Block 78

The update control block 78 is used to update the pseudorandom sequence of the phase noise during the course of the simulation. Since phase noise is a function of both the input voltage and the range setting, the pseudo-random sequence must be updated in the course of the simulation. The noise of the loop can only be calculated from the piece of the simulation when the PLL has settled. Since the calculation is a time consuming process, it is usually only done when necessary. In accordance with one embodiment, an update cycle is scheduled to run about every ten percent of the overall simulation time, and is only executed if the input signals have changed by more than a preset amount since the last update. Other variations on the update cycle may be envisaged within the spirit and scope of the invention Noise Generator Block 86

The noise generator block 86 uses the sequence calculated by the update control block to generate a transient noise signal. In a current implementation, the noise generator produces a piecewise linear signal, which transitions in 20% of the period to a new value, and stays for 80% of the period. The sampling period and the start time of the output sequence can be set by an input parameter to the VCO model.

Figure 5:
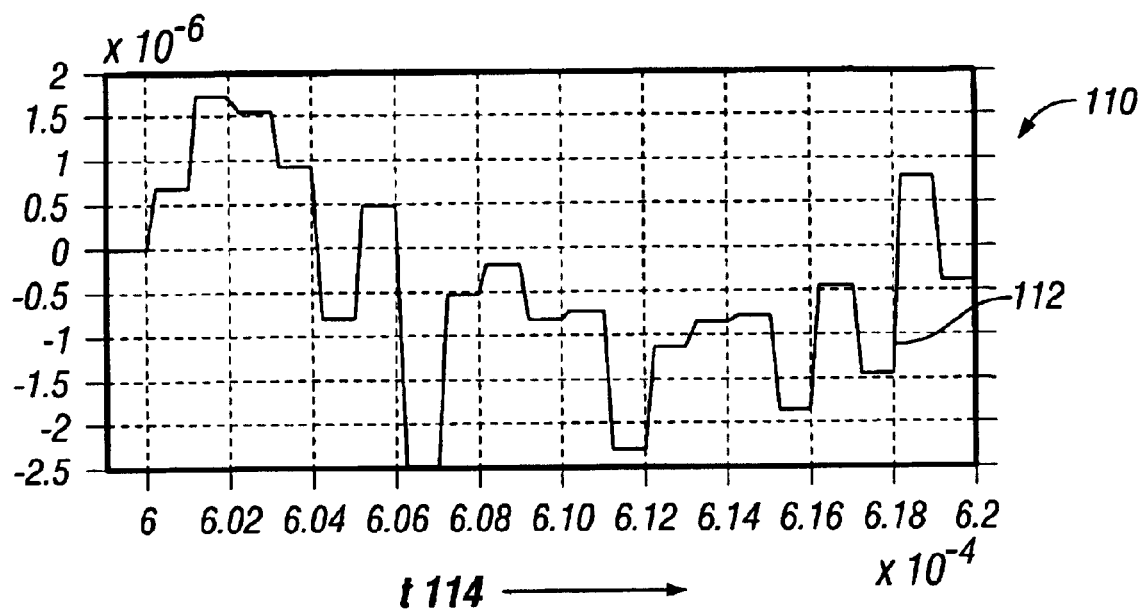
FIG. 5 illustrates a plot showing the output of the noise generator, in this example starting at 600 microseconds and with a sampling period of one microsecond.

FIG. 5 illustrates a plot 110 showing the output of the noise generator, in this example starting at 600 microseconds and with a sampling period of one microsecond. The noise signal 112 varies with time 114. It will be evident to those skilled in the art that different types of transient noise signals, sampling period, or start time, etc. can be used depending on the particular needs of the application.

Analog Backend Processing 72

The analog behavioral portion 72 of the VCO sums the frequency-to-voltage signal with the pseudorandom noise signal to create a combined frequency-noise signal. In one embodiment both the transient noise signal and the signal from the frequency calculator are added and scaled, such that the overall transfer function for the noise signal to VCO frequency is always 1 GHz/N. The combined signal is then inverted (so that it becomes proportional to the period), and is fed to the VCO.

Digital VCO 98

The digital behavioral component 74 of the VCO includes a digital VCO 98 to create both a digital VCO output and an output file. The VCO module generates a digital signal with the resolution of the digital simulator, which is then used for driving the VCO buffers and ultimately the divider. In a typical setup, the simulator resolution may be 10 fs, which corresponds to 20 ppm. This kind of resolution is typically not good enough for low level noise analysis. To address this, the value of each period can be written, with high precision, to a file or into a memory array, for post-processing, for example in Matlab or in another software application, prior to creating the spectrum plot.

Noise Sequence Generation

The pseudorandom signal produced by the noise generator may be thought of as a collection of superposed sine waves passed through a sample-and-hold circuit. The sampling frequency is set as a parameter on the VCO module. The signal before sampling contains sine waves with a lowest frequency of 1 kHz, a frequency increment of 1 kHz, and a maximum frequency which produces four samples per period at the selected sampling frequency. The individual amplitudes are calculated from the phase noise data and the phases are taken from a random generator.

In one embodiment, the phase noise data file 88 is a three-dimensional table describing the phase noise as a function of the VCO input voltage, range setting and noise frequency(relative to the carrier). For the frequency dimension, the data represents the breakpoints of piecewise linear function is in the logarithmic domain.

Whenever the update control block determines that a new sequence must be calculated, the following process is executed:

The phase noise data points at the required frequencies of 1 kHz, 2 kHz etc, are interpolated as a function of range and input voltage;

The levels of the sine waves are calculated for the same frequencies. (In this step, regions with a −30 dB/decade slope are converted to 10 db/decade slope);

For each of the output sine waves, the amplitude is determined by interpolation in the log-log domain from the converted phase noise data points;

A random phase value is assigned. These sine waves are all added together and the samples are calculated. The samples are then stored in an array for use by the generator.

It is possible that when synthesizing such a signal, an undesirable crest factor (peak to rms) can result, which violates the assumption of small signal operation. Therefore the signal is pre-calculated as a sequence and tested for crest factor. If the latter is too high, then the phases are adjusted by a small amount, and the sequence recalculated.

VCO Phase Noise Simulation

In accordance with one embodiment, in a first transient analysis, indicated by step 36 in FIG. 3, the VCO noise is simulated in open loop configuration, for verification of the provided noise data (step 38). The simulation is run for 1 ms, and appropriate values of filter voltage and gain settings are applied. Other simulation times and settings may be used depending on the particular implementation used.

After successful completion of the transient analysis, the phase noise is extracted (step 40) using, for example, a custom Matlab routine. This routine reads the file or the memory array which has all of the periods stored at high precision, calculates the differences in the zerocrossings with respect to a reference signal of the same mean frequency, and runs a Fast Fourier Transform. A plot is then opened (step 42), which shows the phase noise as a function of frequency, normalized to the carrier, in dBc/Hz. Although the measurement frequencies are 1 kHz apart (related to the simulation time of 1 ms), the result is normalized to a bandwidth of 1 Hz.

Simulation of Noise Floor

Each new design should preferably be checked for noise floor. To do this, noise sources are turned off, for example by setting the start time of the noise generator to run after the simulation end time, and by forcing the divider ratios to integer values. In accordance with one implementation, setting the simulator accuracy to an intermediate level is a good compromise between residual noise level and simulation time for this application. This noise floor simulation corresponds to step 44 and 46 shown in FIG. 3. After this simulation completes, the phase noise is extracted (step 48), using the same method as that used for the VCO phase noise analysis described above.

PLL Noise Simulation

The steps described above are in preparation for the final closed loop simulation. Now with all of the noise sources turned on, the dividers are allowed to change as required. Voltage sources, which were used in the open loop simulation to force a particular operating point, are removed. This process corresponds to step 50 in FIG. 3. After this simulation completes, the phase noise is again extracted as explained above.

In accordance with one embodiment, for comparison with measured data from a spectrum analyzer, in step 52 a custom routine (for example a Matlab routine) reconstructs a sine wave from the VCO period data and runs a Fast Fourier Transform on this signal. From this data, a variety of spectrum plots (shown as step 54 in FIG. 3) with different frequency span values, and with linear or logarithmic scale can be produced. Such a plot shows essentially the same information as the phase noise plot, except that the bandwidth here is 1 kHz, and therefore the reported noise levels are 30 dB higher. In practice, the extraction time is typically less than 10 minutes.

Figure 6:
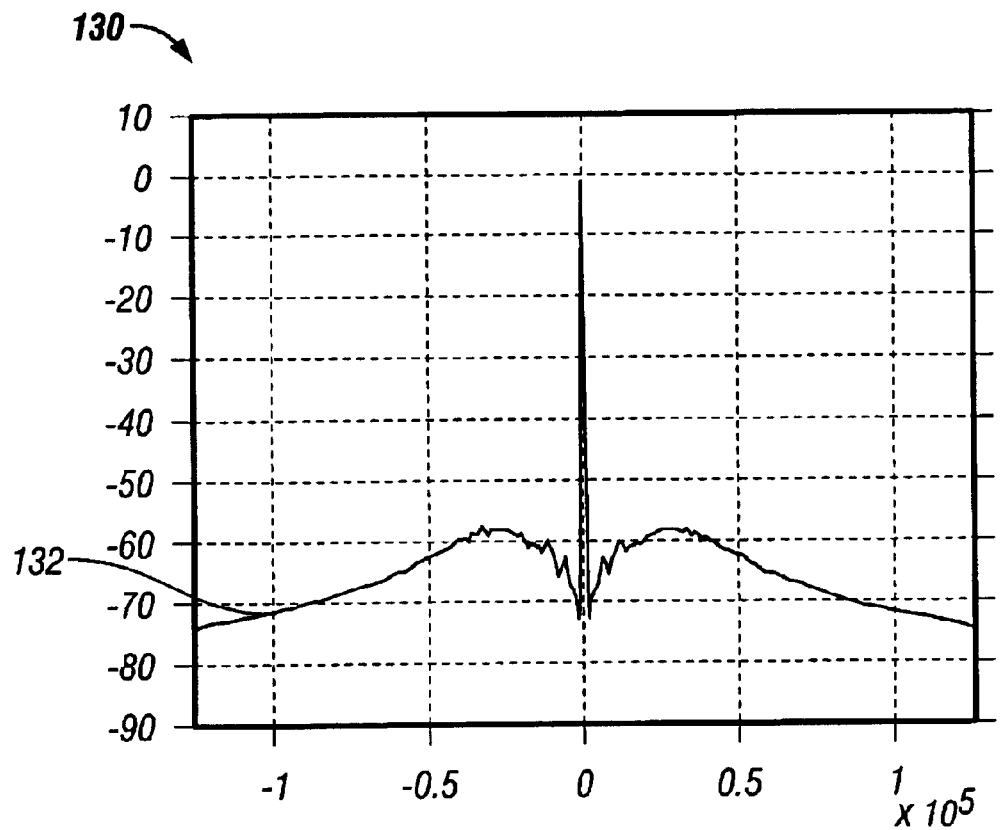
FIG. 6 illustrates a spectrum obtained from a PLL, after an adjustment of the X axis.

FIG. 6 illustrates a spectrum plot 130 obtained from a PLL, after an adjustment of the X axis. As shown in FIG. 6, the spectrum 132 represents the frequency characteristics of the PLL close to the carrier, on a linear scale.

The result of the Fast Fourier Transform is again written to a file which can then be read back into Matlab if desired, and compared with data from other simulations. If these files are stored away between simulations, then the results can be imported again and superposed at a later point in time.

Figure 7:
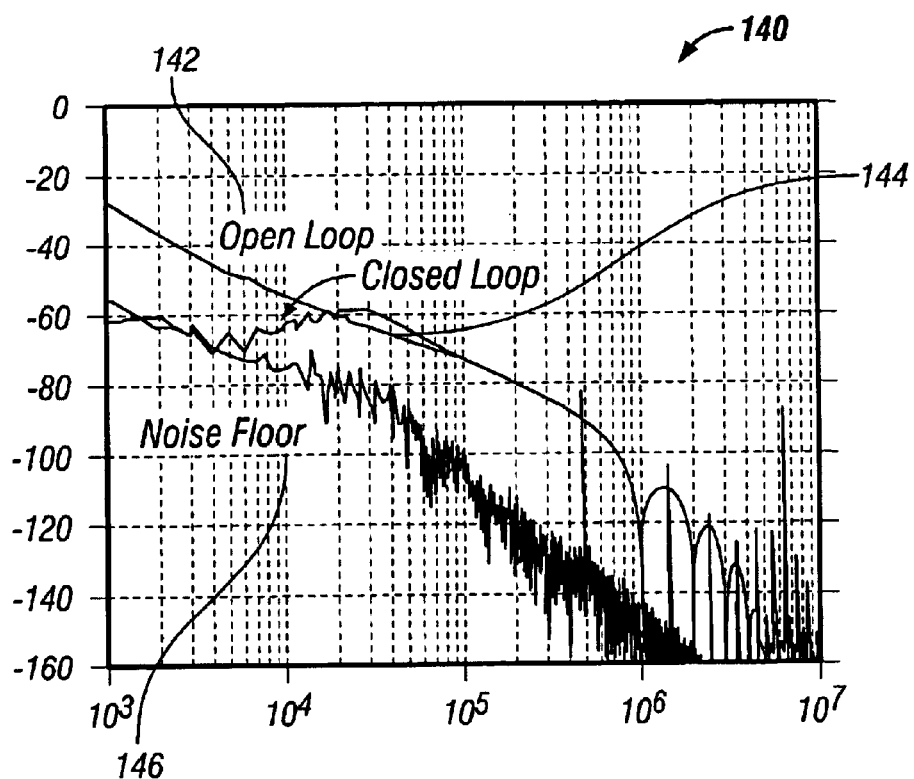
FIG. 7 illustrates the PLL spectrum of the noise floor, PLL open loop, and PLL closed loop on a logarithmic scale for the same set of data.

FIG. 7 illustrates the PLL spectrum plot 140 in which the open loop 142, closed loop 144, and noise floor 146 are all superimposed upon one another to give the designer a quick visual representation of the noise characteristics of the PLL under different conditions. In other instances the data can be exported to a third-party, external or other software application, and used therein to examine the noise characteristics of the PLL.

Variations

Figure 8:
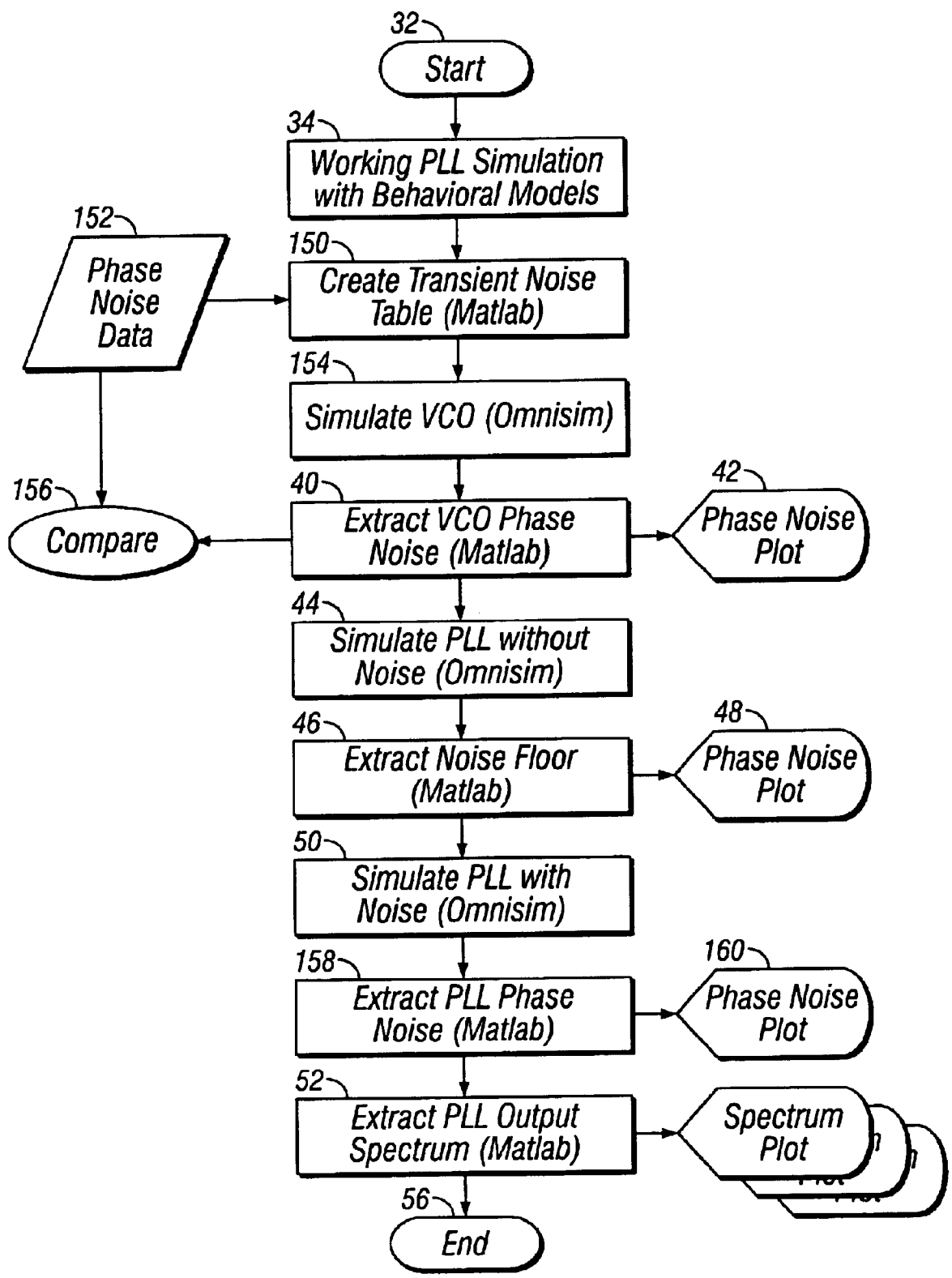
FIG. 8 illustrates a method in accordance with another embodiment of the invention that can be performed by a system such as shown in FIG. 2, to generate a PLL output spectrum.
Figure 9:
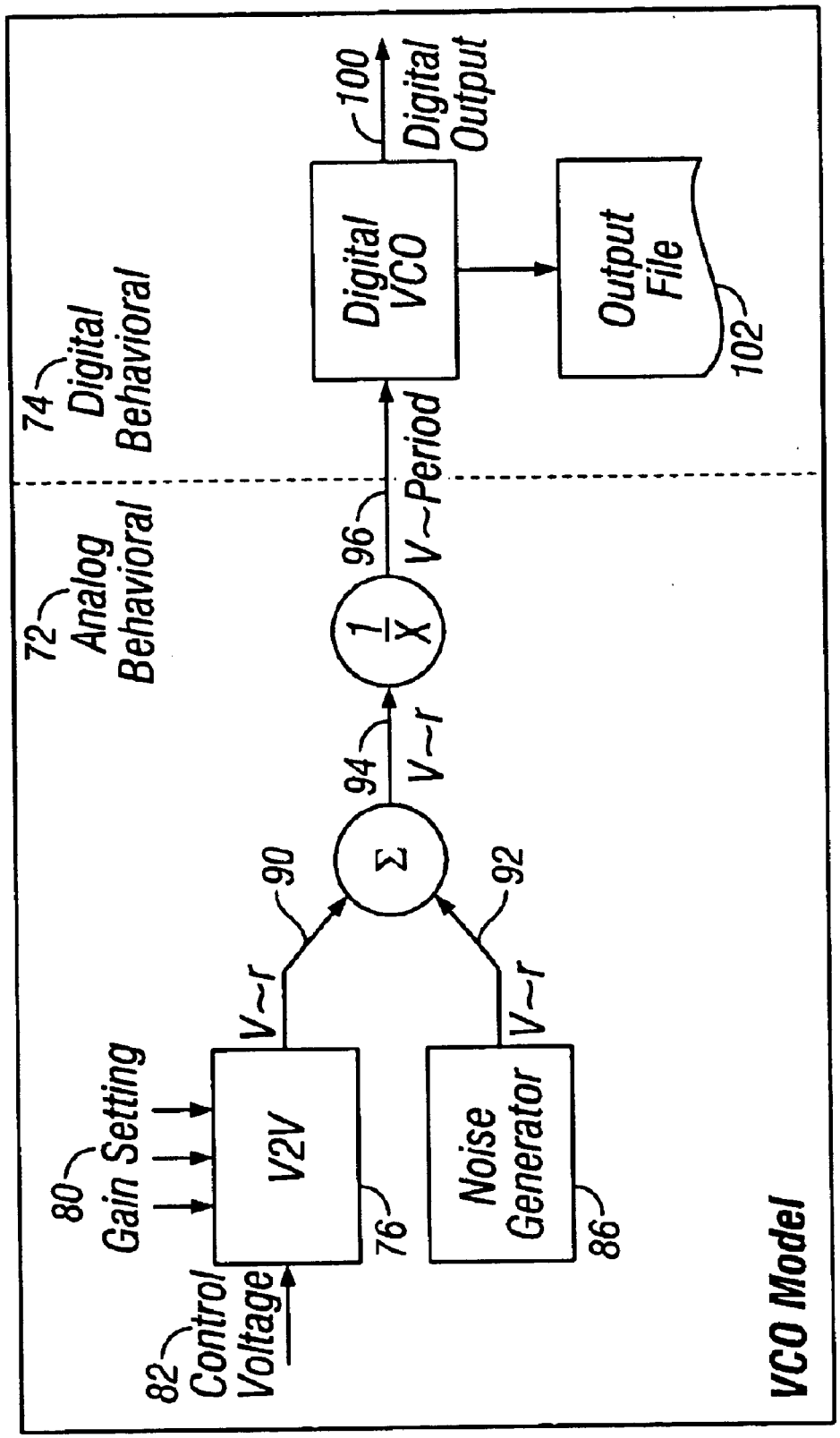
FIG. 9 illustrates a VCO model in accordance with another embodiment of the invention.

Although the system and method described above illustrates how an embodiment of the invention can be used to determine noise characteristics for a PLL, it will be evident to those skilled in the art that additional embodiments can be derived that can similarly be used to produce noise analysis data and spectrum plots. For example, as shown in FIG. 8 and FIG. 9, the system and method may be modified so that the appropriate phase noise data is created using a separate process prior to the simulation. As shown in FIG. 8, an additional step 150 is provided therein to create a transient noise table (for example using a Matlab program in step 152), and to input this transient noise table into the simulation using for example Antrim's Omnisim software (step 154). An optional comparison step 156 allows the operator to compare the VCO phase noise calculated by the simulator to the original phase noise data. The PLL phase noise can be extracted at a later point in time (step 158), to generate a phase noise plot (step 160).

FIG. 9 illustrates an alternate VCO model in which the frequency calculation block (V2V) includes a control voltage and a gain setting, but excludes the update control. In this embodiment, the noise generator uses a data table which is created, for example, using a Matlab routine. In this particular implementation, the noise signal from the generator will not adjust to varying operating conditions of the PLL in the course of the simulation. Other embodiments and variations can be devised within the spirit and scope of the invention.

Optional Comparison Step

Figure 10:
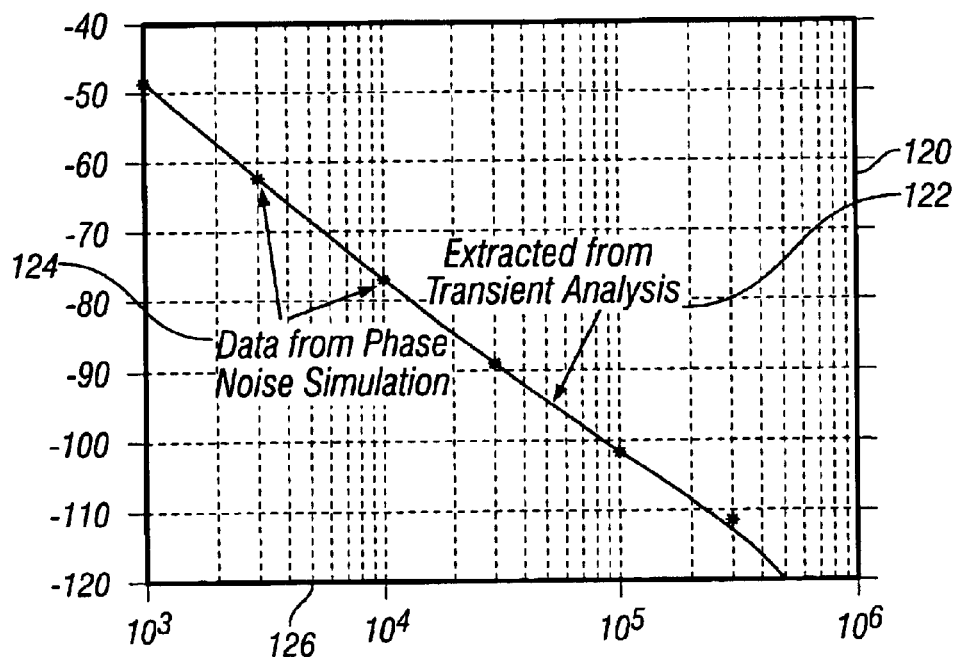
FIG. 10 illustrates a plot showing the extracted VCO phase noise from the transient analysis, together with the original data from the Radio Frequency (RF) simulator.

An optional comparison step 156 allows the operator to compare the VCO phase noise as calculated by the simulator with the original input phase noise data. In this optional step, the result of the Fast Fourier Transform (FFT) can be used to create a plot wherein the phase noise values shown on the plot correspond to the original values used for the noise table, together with a straight line approximation of the data. FIG. 10 illustrates an example of one plot 120 showing the extracted phase noise 122 as generated by the transient analysis simulation. The original phase noise data (indicated by step 88 in FIG. 4) is shown as discrete data points 124. FIG. 10 is useful for verifying that the steps of creating the pseudorandom sequence, injecting the pseudorandom signal into the VCO in the transient analysis, recording the VCO behavior, and then extracting the phase noise from the stored data, actually create the correct result. Plotting the simulated and the input data together in this manner allows the operator to quickly assess whether the VCO model is performing correctly. If the simulation line and the data points substantially superimpose upon one another, then the model can generally be considered to be correct, otherwise it may need to be adjusted, and the simulation re-run.

In one embodiment, the system stores the result of the Fast Fourier Transform in a file which can then be read back into Matlab, and compared with data from other simulations.

In conclusion, a methodology is presented herein which allows for predicting the noise characteristics of a Phase Locked Loop (PLL). The Voltage Controlled Oscillator (VCO) phase noise, and the noise created in the digital circuit by dynamically varying divider ratios, can be included. Other noise sources can be added if their characteristics are known. With modern hardware and computing systems, simulation and post-processing times utilizing the invention can be reduced to less than one hour, and good agreement between measured and simulated data can be obtained. The simulation results depend directly on reliable device characterization data. When using Verilog models and Matlab extraction routines, no specialized additional skills are required on the part of the operator. Therefore the system and methods described herein can be easily adopted and become a standard practice for the typical Radio Frequency (RF) circuit or systems designer.

The present invention may be conveniently implemented using a conventional general purpose or a specialized digital computer or microprocessor programmed according to the teachings of the present disclosure. Appropriate software coding can readily be prepared by skilled programmers based on the teachings of the present disclosure, as will be apparent to those skilled in the software art.

In some embodiments, the present invention includes a computer program product which is a storage medium (media) having instructions stored thereon/in which can be used to program a computer to perform any of the processes of the present invention. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

The foregoing description of the present invention has been provided for the purposes of illustration and description. It is not intended to be exhaustive or to limit the invention to the precise forms disclosed. Many modifications and variations will be apparent to the practitioner skilled in the art. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:

1. A system for simulating the noise characteristics of a phase locked loop, comprising:
    a behavioral simulator, which simulates the phase locked loop as a set of behavioral models, one of which behavioral models includes a voltage controlled oscillator model; and,
    a voltage controlled oscillator model, used by said behavioral simulator to simulate the behavior of the phase locked loop, wherein said voltage controlled oscillator model includes
        a frequency calculation block, which uses previously generated frequency data to calculate the oscillator period or frequency as a function of input voltage and of digital control signals,
        a transient noise generator block, which produces a pseudorandom transient noise signal, and,
        a digital voltage controlled oscillator block, which generates an output signal for the phase locked loop and stores data describing with high precision the noise characteristics of the output signal.

2. The system of claim 1 further comprising:
    an update control, which precalculates a pseudorandom sequence used by the transient noise generator block from previously calculated phase noise data.

3. The system of claim 1 wherein said frequency data is provided to the voltage controlled oscillator model by an external data file.

4. The system of claim 2 wherein said phase noise data is provided to the voltage controlled oscillator model by an external data file.

5. The system of claim 1 wherein the output file includes data for use in generating a noise spectrum plot illustrating the transient noise characteristics of the phase locked loop.

6. The system of claim 1 wherein the digital voltage controlled oscillator block stores the data as an output file.

7. The system of claim 1 wherein the digital voltage controlled oscillator block stores the data as an internal memory array.

8. A method for simulating the noise characteristics of a phase locked loop, comprising the steps of:
    simulating the phase locked loop using behavioral models, one of which behavioral models includes the voltage controlled oscillator model;
    providing a voltage controlled oscillator model, for use by said behavioral simulator in simulating the behavior of the phase locked loop, wherein said voltage controlled oscillator model is used to perform the substeps of
        using previously generated data to calculate oscillator frequency or period as a function of input voltage and of digital control signals, and,
        using phase noise data to produce a transient noise signal; and,
    generating an output signal for the phase locked loop and storing data describing with high precision the characteristics of the output signal.

9. The method of claim 8 further comprising the step of:
    precalculating a pseudorandom sequence as used by the transient noise generator block to produce a pseudorandom transient noise signal.

10. The method of claim 8, further comprising the additional step of:
    generating, using the stored data describing the characteristics of the output signal, a noise spectrum plot illustrating the transient noise characteristics of the phase locked loop.

11. The method of claim 8 wherein said step of storing data includes storing the data as an output file.

12. The method of claim 8 wherein said step of storing data includes storing the data as an internal memory array.

13. A method for simulating the noise characteristics of a phase locked loop, comprising the steps of:
    generating voltage controlled oscillator phase noise data for a particular circuit;
    converting any phase locked loop blocks to calibrated behavioral-level models;
    verifying a phase locked loop simulation using said behavioral-level models, without any noise source being turned on or implemented; and,
    running the transient analysis with a noise generator and all other noise sources turned on to simulate the noise characteristics of the phase locked loop.

14. The method of claim 13, further comprising the additional step of:
    precalculating a pseudorandom sequence as used by the transient noise generator to produce a pseudorandom transient noise signal.

15. The method of claim 13, further comprising the additional step of:
    processing the results of the transient analysis to create a noise spectrum plot.

16. The method of claim 13 wherein said step of generating data includes storing the data as an output file.

17. The method of claim 13 wherein said step of generating data includes storing the data as an internal memory array.

18. A system for simulating the noise characteristics of a phase locked loop, including instructions stored therein which when read and executed cause the system to perform the steps of:
    reading voltage controlled oscillator phase noise data for a particular circuit;

converting any phase locked loop blocks to calibrated behavioral-level models;

verifying a phase locked loop simulation using said behavioral-level models, without any noise generator being turned on or implemented; and, running the transient analysis with a noise generator and all other noise sources turned on to simulate the noise characteristics of the phase locked loop.

19. The system of claim 18, further comprising instructions stored therein which when read and executed cause the system to perform the additional step of:

precalculating a pseudorandom sequence as used by the transient noise generator to produce a pseudorandom transient noise signal.

20. The system of claim 18, further comprising instructions stored therein which when read and executed cause the system to perform the additional step of:

processing the results of the transient analysis to create a noise spectrum plot.

21. The system of claim 18, further comprising instructions stored therein which when read and executed cause the system to perform the additional step of:

storing the data as an output file.

22. The system of claim 18, further comprising instructions stored therein which when read and executed cause the system to perform the additional step of:

storing the data as an internal memory array.

* * * * *